POWER SEMICONDUCTOR GATING CIRCUIT

Filed Dec. 8, 1966 2 Sheets-Sheet 1

INVENTOR.
EDWARD H. DINGER
BY [signature]
HIS ATTORNEY

INVENTOR.
EDWARD H. DINGER
BY Stanley C Corwin
HIS ATTORNEY

United States Patent Office 3,471,716

Patented Oct. 7, 1969

3,471,716

POWER SEMICONDUCTOR GATING CIRCUIT

Edward H. Dinger, Waynesboro, Va., assignor to General Electric Company, a corporation of New York Filed Dec. 8, 1966, Ser. No. 600,140
Int. Cl. H03k *5/00, 5/08, 17/00*
U.S. Cl. 307—268 5 Claims

ABSTRACT OF THE DISCLOSURE

A gating circuit for switching devices such as power SCR's which provides a pulse output of desirable quality to insure turn-on of the SCR's under all conditions. In addition, the circuit provides positive, regenerative and independent control of turn-on and turn-off of the pulse output.

This invention relates to a new and improved gating circuit. More particularly, the invention relates to a new and improved pulse gating circuit for supplying gating-on pulses to gate controlled power semiconductors of the silicon controlled rectifier type.

Gate controlled power semiconductors such as the silicon controlled rectifier, or the recently introduced triac, require the application of a suitable gating-on signal pulse to the control gate thereof concurrently with the application of enabling potentials to their load terminals, to be rendered conductive. The nature of the gating-on signal pulse is determined by the characteristics of the silicon controlled rectifier (hereinafter referred to as an SCR), and particularly the power rating of the SCR. In the case of large power rated SCR's, high energy gating on signal pulses having a steep wave front are required in order to assure proper turn-on of the SCR. In the case of triacs (which are bidirectional conductive devices), it is desirable that a single gating signal source be capable of gating on the triac to allow it to conduct in either direction. It is a known characteristic of the triac that it is more difficult to gate-on for one polarity of supply voltage, for a given polarity gating pulse, than is true for the reverse polarity supply voltage. Because of this characteristic, it is necessary to supply gating-on pulses of sufficient energy and steep waveshape in order to assure turn-on of the triac under all conditions.

It is therefore a primary object of the present invention to provide a new and improved pulse gating circuit for supplying gating-on signal pulses to gate controlled power semiconductors of the SCR and/or triac type.

It has been recognized that gating circuits of the type described, in addition to providing a pulse output of sufficient energy and fast rise time to assure turn-on of gate controlled power semiconductors under all conditions, should provide positive control of the turn-on or the beginning of pulse generation and of pulse turn-off, as well as closely controlled pulse height, width, and spacing between pulses.

It is accordingly another object of the invention to provide an improved pulse gating circuit in which pulse on-time and pulse off-time is independently controlled.

Another object of the invention is to provide an improved pulse gating circuit of the type having regenerative feedback for turn-on and turn-off in which positive starting is insured by isolating the feedback path from the pulse starting current.

The invention includes transistor means having emitter, collector and base electrode means. A transformer having inductively coupled primary and feedback secondary windings is provided. A first impedance means couples the primary winding and the emitter-collector of the transistor means in a series circuit across a source of energizing potential. The gating circuit is completed by turn-on circuit means including the feedback secondary winding of the transformer which is operatively coupled to the base of the transistor for applying turn-on potentials thereto to cause the transistor means to turn on. The circuit is arranged in such a manner that the primary and feedback secondary windings and the first impedance means coact to cause the transistor means to turn on and off after an interval of conduction in a relaxation oscillatory manner. In preferred embodiments of the invention, the transformer has at least one additional secondary winding (and possibly more) inductively coupled to the primary winding for deriving output gating signal pulses for application to the control gate of the gate controlled power semiconductor to be turned on. The invention may also include a source of control signals operatively coupled to the base of the transistor means for automatically controlling turn-on and turn-off of the transistor means.

Other objects, features and many of the attendant advantages of this invention will be better understood after a reading of the following description considered in connection with the accompanying drawings; wherein.

Figure 1:
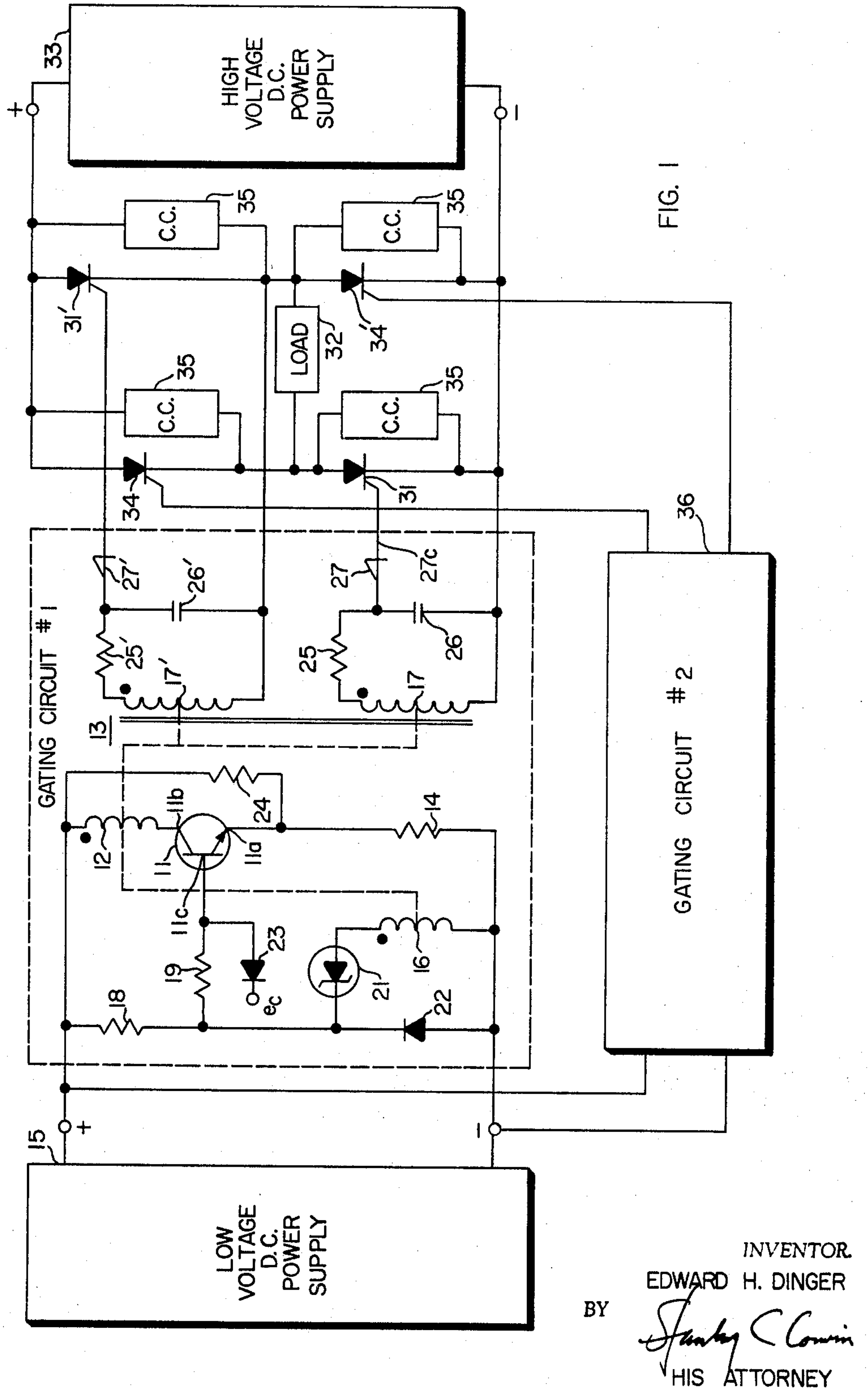
FIGURE 1 is a schematic circuit diagram of a new and improved pulse gating circuit constructed in accordance with the invention and illustrates the pulse gating circuit used in conjunction with a power inverter system.

The new and improved pulse gating circuit shown in FIGURE 1 of the drawings is comprised by a transistor means 11 having an emitter electrode 11*a*, a collector electrode 11*b* and a base electrode 11*c*. The transistor 11 shown in an NPN junction transistor having its emitter-collector connected in series circuit relationship with the primary winding 12 of a transformer 13 and a first impedance means 14 comprised by a resistor. The series circuit comprised by the emitter-collector of transistor 11, primary winding 12 and resistor 14 is connected across the output terminals of a low voltage direct current power supply 15. The transformer 13 has a first or feedback secondary winding 16 and at least two additional (or output) secondary windings 17 and 17′, respectively, which are inductively coupled to the primary winding 12. The design of transformer 13 is such that extremely tight coupling is provided between the primary and secondary windings. This may be achieved by winding the turns of the primary over the full length of the core and over one another. In this manner tight coupling will result which contributes to the fast rise time of the gating-on pulses produced by the circuit.

Turn-on circuit means are provided for the transistor 11 which includes resistors 18 and 19, respectively, connected in series circuit relationship between the positive terminal of the low voltage DC power source 15 and base 11*c* of transistor 11. The turn-on circuit means further comprises the first or feedback secondary winding 16 of transformer 13 that is coupled to the base of transistor 11 for applying turn-on potentials thereto. A blocking unidirectional conducting means formed by a Zener diode 21 is coupled between the first secondary winding 16 and the base of transistor 11 by resistor 19. As a consequence of this arrangement, the Zener diode 21 normally serves to block the initial turn-on current from the low voltage DC source 15, from flowing through the first secondary winding 16 thereby isolating the starting current supplied to transistor 11 by resistors 18 and 19 from the feedback circuit. A circulating unidirectional current conducting means comprised by a conventional semiconductor diode 22 is connected in parallel circuit relationship with the series connected feedback secondary winding 16 and Zener diode 21. The purpose of the circulating diode 22 will be appreciated more fully hereinafter in connection with the discussion of the operation of the new and improved gating circuit.

A source of low level direct current control signals indicated at $e_c$ is operatively coupled to the base of transistor 11 through a second blocking diode 23. The low level source of direct current control signals $e_c$ may comprise any source of such signals, such as a temperature sensitive thermistor, a strain sensitive device, a speed sensitive tachometer, a low level logic signal, etc., for providing variable magnitude and polarity direct current controlling signals to the base of transistor 11. As will be appreciated more fully hereinafter, the controlling signals $e_c$ operate in conjunction with the primary and feedback secondary windings 12 and 16 of transformer 13, and the first impedance means 14 to automatically control turn-on and turn-off of the transistor 11, and hence control the output pulses produced by the gating circuit. To assure positive control of turn-on and turn-off of the transistor 11 by the control signals $e_c$, a second voltage dropping impedance means comprised by a resistor 24 is connected between the positive terminal of the low voltage DC power supply 15 and the emitter 11*a* of transistor 11, as will be more fully explained below.

Output gating signal pulses produced by the gating circuit appear across the second or output secondary winding 17 and are supplied through a voltage limiting resistor 25 to a pulse forming network comprised by a capacitor 26 and an avalanche diode 27. The avalanche diode 27 is a commercially available device having a characteristic such that it is capable of holding off voltage below a certain predetermined threshold level, and upon the voltage attaining this threshold level, the device becomes fully conductive. With this arrangement, the voltage appearing across the output secondary winding 17 charges the capacitor 26 until it reaches the threshold level of the avalanche diode 27. Upon this occurrence, the avalanche diode 27 breaks down and conducts and produces a sharply rising, high energy voltage pulse at its output terminal which can be supplied to a gate controlled power semiconductor for causing the same to be turned on. A similar pulse forming network 25′, 26′ and 27′ is coupled across the output secondary winding 17′ for developing a second high energy turn-on pulse that can be applied to a second gate controlled power semiconductor.

The sharply rising, high energy gating signal pulses appearing at the output of the avalanche diodes 27 and 27′ are supplied to the control gates of a pair of high power SCR's 31 and 31′. The high power SCR's 31 and 31′ are connected in series circuit relationship with a load 32 across a high voltage direct current power supply 33. The load 32 is connected in a reverse polarity sense in series circuit relationship with a second set of high power SCR's 34 and 34′ across the high voltage direct current power supply 33 in the conventional manner of a single phase power inverter circuit. The single phase power inverter circuit is completed by commutating circuits 35 connected across each of the high power SCR's 31, 31′, 34 and 34′ and by the provision of a second gating circuit 36 whose output is connected to the control gates of the high power SCR's 34 and 34′. The second gating circuit 36 is identical in construction and operation to the gating circuit 10 with the exception that it is controlled by a second properly phased source of control signals (not shown) to cause the high power SCR's 34 and 34′ to conduct substantially 180 electrical degrees behind the conduction intervals of the high power SCR's 31 and 31′.

In operation the gating circuit shown in FIGURE 1 functions in the following manner. When power is initially applied to the circuit by the low voltage direct current power supply 15, current flows from the positive terminal through the resistors 18 and 19 into the base 11*c* of transistor 11. This causes transistor 11 to conduct and apply voltage to the primary winding 12 of transformer 13. Due to inductive coupling, voltage appears at the feedback secondary winding 16 which is positive at the dot end of the winding. This positive voltage is supplied back through the Zener diode 21 and resistor 19 to the base of transistor 11 thereby causing transistor 11 to turn on fully. Thus, it can be appreciated that the connection of the feedback secondary winding 16 in the circuit is regenerative and causes the transistor 11 to switch full on.

The voltage applied across the primary winding 12 of transformer 13 is determined by the value of the supply voltage, minus the drop across the saturated transistor 11 and minus the voltage drop across the first resistor 14. The voltage across resistor 14 is substantially fixed by the supply voltage and the turns ratio between primary winding 12 and secondary winding 16. The value of resistor 14 determines the amount of emitter current that will flow. This emitter current is made up of the load current flowing through primary winding 12, the transformer exciting current and the base current. As the exciting current builds up and particularly when the core of transformer 13 saturates, the load current and exciting current will supply substantially all the current that resistor 14 will permit to flow in the emitter circuit and the base current will fall. The base current quickly becomes insufficient to support the emitter current required and transistor 11 turns off. It should be noted that although the point at which transistor 11 begins to turn off is also affected to some extent by the current gain of the circuit, this contribution to the turn-off process can be made, by proper design, to be small in relation to the effect of the transformer exciting current on turn-off as described above.

Once transistor 11 starts to turn off, the process is regenerative in the reverse direction. Because of the exciting current flowing in the primary winding 12 at the time of turn-off, the voltages on all windings will reverse at the instant of turn-off in an attempt to find a path for the ampere turns flowing in the primary winding 12. The path provided is that consisting of the first secondary winding 16, Zener diode 21 and the circulating diode 22. The energy trapped in the exciting winding 16 is eventually (upon the breakdown of Zener diode 21) delivered at constant voltage (the voltage of Zener diode 21) to circulating diode 22 and Zener diode 21. During this time the voltages on all of the transformer windings 12, 16 and 17 are maintained at a predetermined voltage value related to the Zener diode 21 voltage and the turns ratios of the windings. Also during this time, the starting current normally supplied through resistor 18 is diverted through circulating diode 22 from the base of transistor 11 thereby providing additional assurance that transistor 11 is completely turned off. After all of the exciting energy in the windings has been dissipated, the voltages across all of the transformer windings 12, 16 and 17 go to zero. This completes one output gating pulse and the off-time period or space until the next pulse is to be generated. Subsequently, the starting current again begins to flow through the resistors 18 and 19 into the base 11*c* of transistor 11 and the cycle starts all over again. In this manner, a series of pulses is generated in output secondary windings 17, 17′ which are supplied through the pulse forming networks to the control gates of the high power SCR's being controlled.

From the above description, it will be seen that the function of the Zener diode 21 is to control the time between pulses. The energy stored in the transformer windings at the time transistor 11 turns off is dissipated at a rate fixed by the constant voltage clamp of the Zener diode.

Automatic control of the above described oscillatory action may be achieved by means of the control signal $e_c$ supplied to the base of transistor 11 through the blocking diode 23. With the control voltage $e_c$ reduced to zero, measured with respect to the negative terminal of the power supply 15, it is seen that the feedback path involving feedback secondary winding 16 is shorted out. As a result, oscillations of the circuit will stop even if the supply voltage is present. If the control voltage $e_c$ is made positive, or the circuit to the source $e_c$ opened, continued operation of the gating circuit will commence immediately. Resistor 24 is provided in order to apply a slight positive bias to the emitter 11*a* of transistor 11 to compensate for the voltage drop of diode 23 and thereby give the control signal $e_c$ positive control over operation of the circuit.

The output secondary windings 17, 17' supply their voltage through the resistors 25, 25' to capacitors 26, 26'. When the voltage across capacitors 26, 26' exceeds the gate cathode voltage of the SCR's 31 and 31' and the breakdown voltage of the four-layer avalanche diodes 27, 27', the voltage of the capacitors is applied very quickly to the control gates of the SCR's 31 and 31'. With this arrangement, a gate cathode voltage rise time of 0.2 microsecond has been achieved. Capacitors 26, 26' insure that the output voltage of the pulse gating circuit is above a predetermined level, the level fixed by the breakdown of the avalanche diodes 27, 27', and serve to store energy. Thus, when diodes 27, 27' break down, the pulse emitted has high energy with a steep wave front. While the circuit preferably employs avalanche diode 27, 27', it should be understood that this component serves to improve the pulse rise time. It could be replaced with an ordinary silicon diode with some loss in rise time. With such an arrangement and by proper transformer design, a rise time on the order of 0.5 of a microsecond could be achieved.

Figure 2:
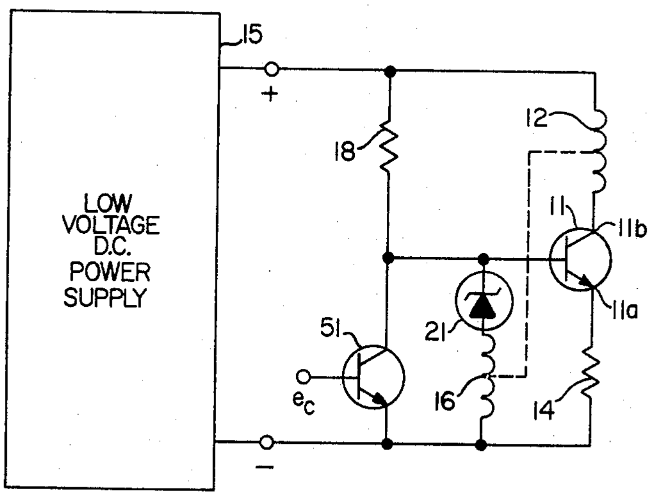
FIGURE 2 is a schematic circuit diagram of an alternative control circuit arrangement that uses a control transistor to apply controlling signals to the pulse gating circuit.

FIGURE 2 is a schematic circuit diagram of a modified form of a control circuit arrangement for use in the novel power semiconductor gating circuit shown in FIGURE 1. In the control circuit arrangement of FIGURE 2, certain components have been eliminated in the interest of economy, size and cost, and in addition the arrangement is such that positive going control signals $e_c$ may be applied to the gating circuit to cause it to turn off. For this purpose, in the circuit arrangement of FIGURE 2, a control NPN junction transistor 51 is connected between the base of the transistor 11 and the negative power supply terminal in place of diode 23. With this change, resistors 19 and 24 can be eliminated. The control transistor 51 has its collector connected to the base of transistor 11, its emitter connected to the negative power supply terminal and the source of control signals $e_c$ is connected directly to its base. Because control transistor 51 is an NPN junction transistor, positive going signals applied directly to its base cause the transistor 51 to turn on, shorting feedback winding 16, and causing the power semiconductor gating circuit to turn off. In addition, it might be noted that the control transistor 51 provides some gain so that weaker or lower level control signals $e_c$ may be applied directly to the base of control transistor without requiring prior amplification. In all other respects, the circuit configuration of FIGURE 2 operates in the same manner as that described with relation to FIGURE 1.

Figure 3:
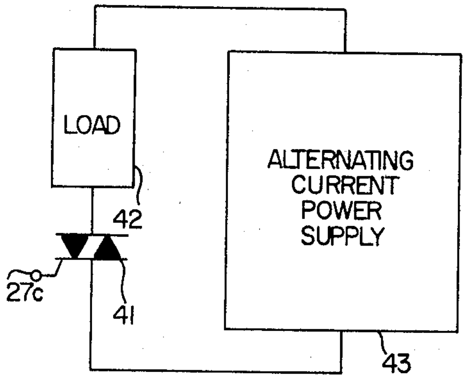
FIGURE 3 is a functional block diagram of an alternative form of power circuit employing triacs which can be controlled with the pulse gating circuit shown in detail in FIGURE 1.

FIGURE 3 of the drawings illustrates a modified form of power circuit which can be employed with the new and improved gating circuit of the invention. This can be achieved by connecting the output from the avalanche diode 27 shown at 27*c* in FIGURE 1 to the correspondingly marked point 27*c* shown in FIGURE 3. The point 27*c* in FIGURE 3 is connected directly to the control gate of a triac bidirectional conducting device 41 that has its load terminals connected in series circuit relationship with a load 42 across an alternating current power supply 43. By appropriate design of the repetition frequency of the output gating pulses produced by the pulse gating circuit relative to the frequency of the alternating current power supply 43, the precise point in the phase of the alternating current supply potential from 43 at which triac 41 is rendered conductive can be controlled. In this manner, phase control of the current supplied through load 42 can be achieved. While the circuit arrangement shown in FIGURE 3 does not add additional information regarding the construction and manner of operation of the new and improved gating circuit, it does serve in conjunction with FIGURE 1 to illustrate the wide number and types of power circuits which can be controlled with the new and improved gating circuit.

From the foregoing description, it can be appreciated that the present invention provides a new and improved pulse gating circuit for supplying gating-on signal pulses of high energy and steep wave front to gate controlled power semiconductors of the SCR and triac type. The new and improved pulse gating circuit is designed in such a manner that it is capable of applying sharply rising, high energy gating-on pulse of closely controlled pulse height and width and having accurately controlled distances between pulses. The gating-on pulses can be immediately started and stopped by means of a low level direct current control signal in such a manner that the first pulse is full size and occurs instantaneously with application of the control signal. When the control signal to turn off is applied, operation stops immediately even to the extent of interrupting a pulse before its full width has been obtained. The gating circuit of the invention produces output pulses having extremely fast rise time which have high power per pulse, but over a series of such pulses have low average power. The extremely fast rise time of the gating-on pulses reduces or relaxes the need for power semiconductors having near identical firing potentials. This is due to the fact that the fast rise time of the gating-on pulses goes through the firing potential levels of all the power semiconductors so fast that substantial identical firing is achieved.

The described embodiment of the pulse generating circuit shows a transistor as the switching element. It should be understood that other gate controlled turn-on and turn-off switching devices could be readily substituted. For example, transistor 11 could be replaced by a gate turn-off silicon controlled rectifier, commonly called a GTO, by a silicon controlled switch, commonly called an SCS, or even by a tube. It is thus intended that the specific switch device chosen should be taken by way of description and not in limitation.

What is claimed and desired to be secured by Letters Patent of the United States is:

1. A gating circuit for gate controlled semiconductors including in combination a switch having a control electrode for turning said switch on and off, a saturable transformer having primary and feedback secondary windings, first impedance means coupled in a series circuit with the primary winding and said switch across a source of energizing potential, and turn-on circuit means including said secondary winding coupled to the control electrode of said switch in feedback relation for applying turn-on potentials to said control electrode to cause said switch to turn on, said turn-on circuit means comprising second impedance means coupled between the source of energizing potential and the control electrode of said switch for initially turning on said switch, blocking unidirectional conducting means coupling the feedback secondary winding of the transformer to said control electrode, said blocking unidirectional conducting means serving to block initial turn-on current flow from the source of energizing potential through the feedback secondary winding, circulating unidirectional current conducting means coupled in parallel circuit relationship with the feedback secondary winding of the transformer and said blocking unidirectional conducting means for circulating current therethrough during turn-off of said switch in a direction opposite to the current flow during turn-on, said circulating unidirectional current conducting means being thereby coupled to said second impedance means to divert current from being applied to said switch by said second impedance means during turn-off, said primary and feedback secondary windings and first impedance means co-acting to cause said switch to turn off after an interval of conduction in a relaxation oscillatory manner.

2. A gating circuit according to claim 1 wherein said turnon circuit means further includes a source of control signals operatively coupled to the control electrode of said switch for controlling turn-on and turn-off of said switch in conjunction with the primary and feedback secondary windings of the transformer and said first impedance means.

3. A gating circuit according to claim 1 wherein the transformer has a number of additional secondary windings for deriving output gating pulses.

4. A gating circuit according to claim 3 wherein each second secondary winding is operatively coupled to an output gate pulse forming network comprised by a capacitor coupled across said secondary winding and an avalanche diode coupled to said capacitor for sensing the voltage thereacross and deriving an output gating pulse upon the voltage across the capacitor reaching a predetermined level.

5. A gating circuit according to claim 4 wherein said switch is a transistor, said blocking unidirectional conducting means is a Zener diode, and said circulating unidirectional current conducting means is a conventional semiconductor diode.

References Cited

UNITED STATES PATENTS

| | | | |
|---|---|---|---|
| 2,957,145 | 10/1960 | Bernstein | 331—112 |
| 2,983,878 | 5/1961 | Priebe | 331—112 |
| 3,219,844 | 11/1965 | Martin | 307—265 XR |
| 3,299,369 | 1/1967 | Vercellotti et al. | 331—112 |

JOHN S. HEYMAN, Primary Examiner

JOHN ZAZWORSKY, Assistant Examiner

U.S. Cl. X.R.

307—237, 252, 275, 287